United States Patent
Cohen

(10) Patent No.: US 10,466,321 B2
(45) Date of Patent: Nov. 5, 2019

(54) SYSTEMS AND METHODS FOR EFFICIENT TRAJECTORY OPTIMIZATION IN MAGNETIC RESONANCE FINGERPRINTING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

(*) Notice: Subject to any disclaimer, the term of this patent is extended or adjusted under 35 U.S.C. 154(b) by 498 days.

(21) Appl. No.: 15/294,989

(22) Filed: Oct. 17, 2016

(65) Prior Publication Data

US 2017/0139025 A1 May 18, 2017

Related U.S. Application Data

(60) Provisional application No. 62/254,354, filed on Nov. 12, 2015.

(51) Int. Cl.
*G01V 3/00* (2006.01)
*G01R 33/48* (2006.01)
*G01R 33/24* (2006.01)
*G01R 33/50* (2006.01)

(52) U.S. Cl.
CPC ........ *G01R 33/4818* (2013.01); *G01R 33/243* (2013.01); *G01R 33/50* (2013.01)

(58) Field of Classification Search
CPC .................................................. G01R 33/4818
USPC .................................................. 324/309, 307
See application file for complete search history.

(56) References Cited

U.S. PATENT DOCUMENTS

| 8,723,518 B2 | 5/2014 | Seiberlich et al. |
| 2015/0346300 A1* | 12/2015 | Setsompop ........ G01R 33/4828 324/309 |
| 2016/0116559 A1 | 4/2016 | Cohen |
| 2016/0282436 A1* | 9/2016 | Cloos ..................... A61B 5/055 |
| 2016/0291107 A1* | 10/2016 | Rosen .................. G01R 33/543 |

FOREIGN PATENT DOCUMENTS

WO      2015160400 A2      10/2015

* cited by examiner

*Primary Examiner* — Louis M Arana
(74) *Attorney, Agent, or Firm* — Quarles & Brady LLP

(57) ABSTRACT

Systems and methods for acquiring magnetic resonance fingerprinting (MRF) data includes performing a schedule optimization that sequentially selects discrimination at each trajectory to yield an optimal trajectory and controlling a magnetic resonance imaging (MRI) system to perform a pulse sequence using the optimal trajectory to acquire MRF data. The process also includes estimating quantitative parameters of the subject using the MRF data by comparing the MRF data to a dictionary database and generating a map of quantitative parameters of the subject using the estimated quantitative parameters of the subject and the MRF data.

20 Claims, 5 Drawing Sheets

SYSTEMS AND METHODS FOR EFFICIENT TRAJECTORY OPTIMIZATION IN MAGNETIC RESONANCE FINGERPRINTING

CROSS-REFERENCE TO RELATED APPLICATIONS

This application is based on, claims priority to, and incorporates herein by reference in its entirety, U.S. Provisional Patent Application Ser. No. 62/254,354, filed Nov. 12, 2015, and entitled, "SYSTEM AND METHOD FOR EFFICIENT TRAJECTORY OPTIMIZATION IN MAGNETIC RESONANCE FINGERPRINTING."

STATEMENT REGARDING FEDERALLY SPONSORED RESEARCH

N/A

BACKGROUND

The present disclosure relates to systems and methods for magnetic resonance imaging ("MRI"). More particularly, systems and methods are described for optimizing acquisitions for magnetic resonance fingerprinting applications.

Magnetic resonance fingerprinting ("MRF") is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in, for example, U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle ("FA"), radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

In order to reduce the scan time required for MRF, current methods either vastly undersample k-space by sampling along a single spiral at each acquisition or alternatively sample the entire k-space using an echo-planar imaging ("EPI") based sampling. While each method has its advantages, they are not without drawbacks as well. For example, undersampling a spiral sampling trajectory yields significant artifacts, which then require a large number of acquisitions to obtain an accurate match. On the other hand, EPI-based methods suffer from field inhomogeneity artifacts inherent to EPI and are therefore not suitable for high fields.

Given the above, there remains a need for improved an MRF acquisition techniques.

SUMMARY

The present disclosure overcomes the aforementioned drawbacks by maximizing the discrimination at each trajectory step sequentially or deterministically. Magnetic resonance fingerprinting (MRF) data can be acquired by performing a schedule optimization that sequentially selects discrimination at each trajectory to yield an optimal trajectory and controlling a magnetic resonance imaging (MRI) system to perform a pulse sequence using the optimal trajectory to acquire MRF data.

In accordance with one aspect of the present disclosure, a magnetic resonance imaging (MRI) system is disclosed. The MRI system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals from the subject using a coil array and a computer system. The computer system is programmed to perform a deterministic schedule optimization method to select pulse sequence parameters that minimize schedule lengths needed to fully sample k-space with each repetition time (TR) of the pulse sequence. The computer system is further programmed to control the MRI system to acquire magnetic resonance fingerprinting (MRF) data from the subject by performing the pulse sequence, estimate quantitative parameters of the subject using the MRF data by comparing the MRF data to a dictionary database, and generate a map of quantitative parameters of the subject using the estimated quantitative parameters of the subject and the MRF data.

In accordance with another aspect of the present disclosure, a method is provided for generating a map of quantitative parameters of a subject using a magnetic resonance imaging (MRI) system. The method includes performing a schedule creation that sequentially selects discrimination at each time step to yield a preferred schedule and controlling the MRI system to perform a pulse sequence using the preferred schedule to acquire magnetic resonance fingerprinting (MRF) data. The method also includes estimating quantitative parameters of the subject using the MRF data by comparing the MRF data to a dictionary database and generating a map of quantitative parameters of the subject using the estimated quantitative parameters of the subject and the MRF data.

In accordance with yet another aspect of the present disclosure, a method is provided for generating a map of quantitative parameters of a subject using a magnetic resonance imaging (MRI) system. The method includes performing a deterministic schedule optimization method to select pulse sequence parameters that minimize schedule lengths needed to fully sample k-space with each repetition time (TR) of the pulse sequence. The method also includes controlling the MRI system to acquire magnetic resonance fingerprinting (MRF) data from the subject by performing the pulse sequence and estimating quantitative parameters of the subject using the MRF data by comparing the MRF data to a dictionary database. The method further includes generating a map of quantitative parameters of the subject using the estimated quantitative parameters of the subject and the MRF data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1A:
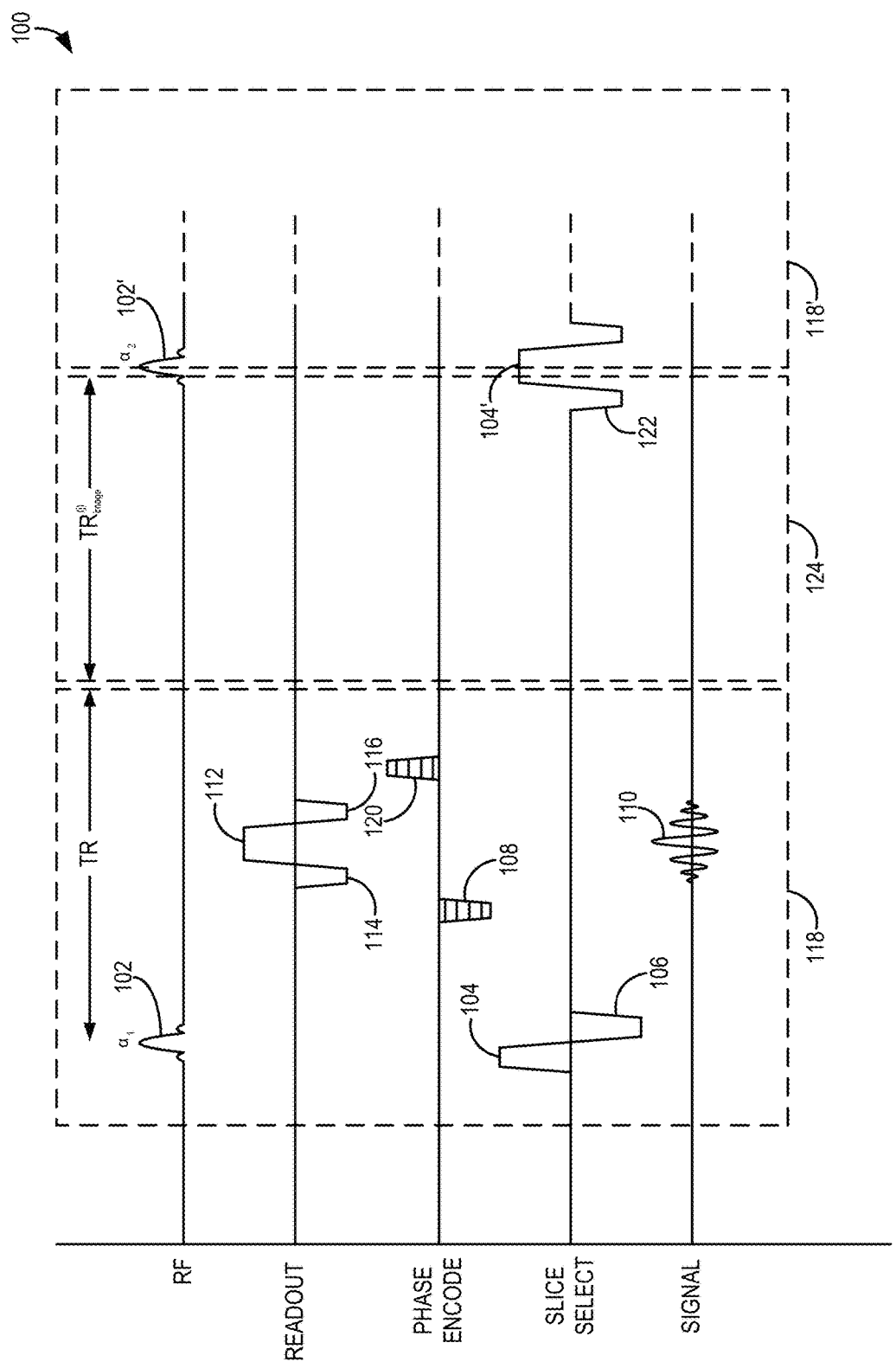
FIG. 1A is a pulse sequence diagram illustrating an example of a pulse sequence in accordance with the present disclosure.

In general, MRF techniques utilize a data acquisition scheme that causes signals from different materials or tissues to be spatially and temporally incoherent by continuously varying acquisition parameters throughout the data acquisition process. Examples of acquisition parameters that can be varied include flip angle ("FA"), radio frequency ("RF") pulse phase, repetition time ("TR"), echo time ("TE"), and sampling patterns, such as by modifying readout encoding gradients. In typical MRF approaches, the acquisition parameters are generally varied in a pseudorandom manner.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

To uniquely distinguish between various different tissue parameters, current implementations of MRF generally require a large number of acquisitions (e.g., greater than 1000) for each phase encoding line. Although the increased scan time can be mitigated by heavily undersampling the k-space, severe artifacts are incurred in the process requiring an increased number of measurements to overcome. Instead, k-space may be fully sampled. However, a key difficulty in fully sampling k-space (fully sampling k-space refers to acquiring a number of samples indicated by the Nyquist criterion) is that the magnetization for each k-space line must have the same initial starting point in order to obtain images that are artifact free at each acquisition. However, since each phase encoding line is acquired with a set of TR/FA defined by the fingerprinting schedule, the object's spin magnetization after the acquisition of the first phase encoding line will depend on the evolution of the magnetization up until that point. Unless a suitable delay is applied to allow the magnetization to completely recover the resulting images will have significant artifacts. This delay (which is T1 dependent) may be several seconds long. With a large number of acquisitions for each phase encoding line, this delay severely increases the minimum scan time achievable.

To overcome this difficulty, the present disclosure provides systems and methods to perform rapid MRF acquisitions.

In particular, the trajectory of flip angles (FA) and repetition times (TR) can be selected, or adjusted, or optimized to maximize discrimination between various tissue types and allow a reduction in the number of measurements necessary. This can be achieved by using an optimization algorithm to search the TR/FA parameter space to find a set of TR/FA values that minimize the off-diagonal elements of the dot product matrix. Such a method is described in co-pending application Ser. No. 14/921,577, filed Oct. 23, 2015, and incorporated herein by reference in its entirety.

Although effective, it may be desirable to balance different constraints or preferences for some clinical settings. For example, depending on the optimization algorithm chosen, the algorithm may converge to a local minimum or else require long times to approach the global optimum. Additionally, the total processing time may be difficult to predict and can be extensive for long trajectories. Also, the optimum obtained can be dependent on the initial points chosen, which reduces the algorithm's reproducibility. However, as described herein, these challenges can be overcome.

Figure 1B:
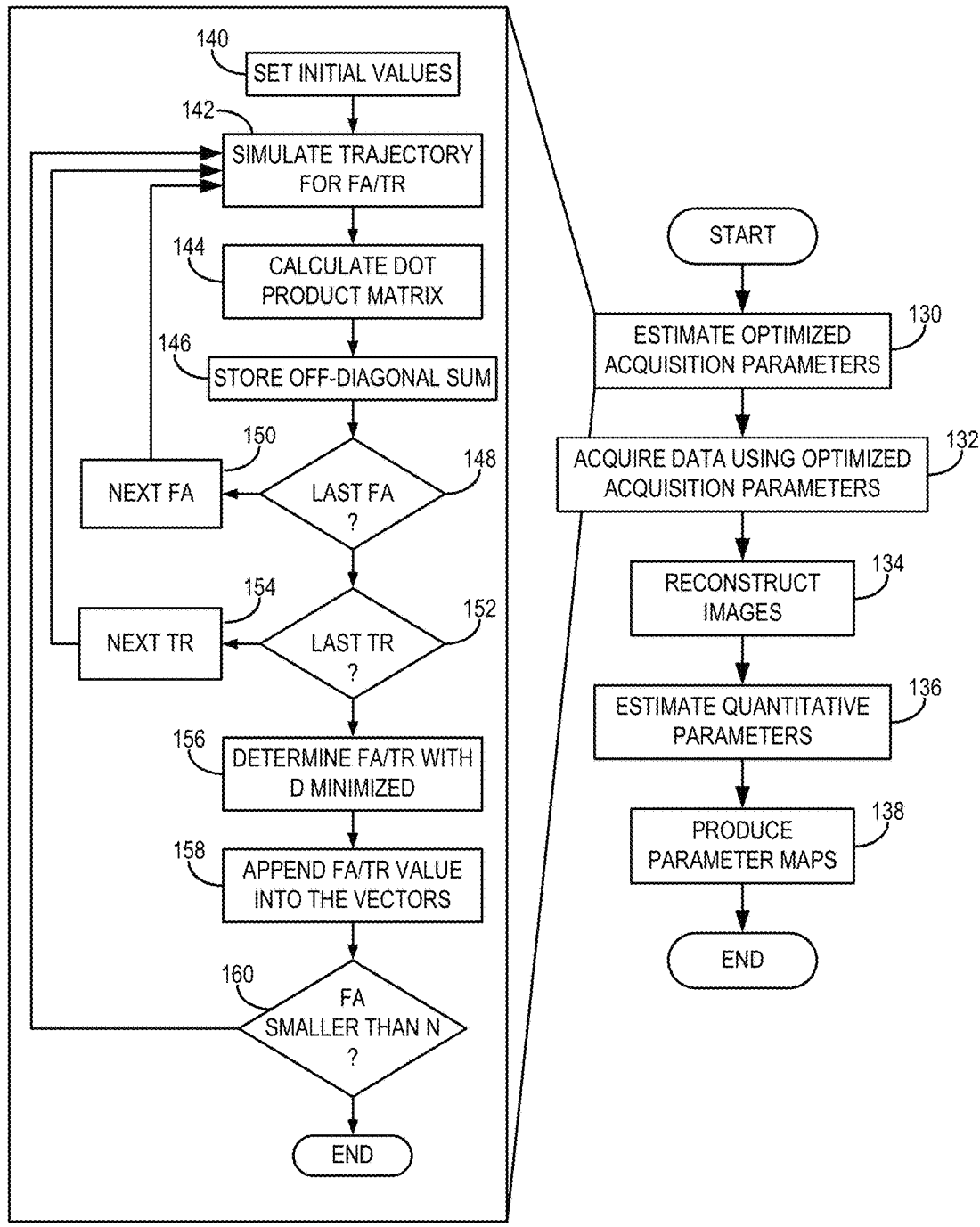
FIG. 1B is a flow chart setting forth one example of steps for a method in accordance with the present disclosure.

Referring now to FIG. 1B, a flowchart is provided that sets forth the steps of one non-limiting example method for estimating quantitative parameters from data acquired using acquisition parameters that have been selected to reduce the number of acquisitions necessary to desirably sample the quantitative parameter space and overcomes the aforementioned challenges. The process begins by generating a vector, or schedule, of acquisition parameters that has been selected (or, as a non-limiting example, optimized) to reduce the number of acquisitions necessary to sufficiently sample the quantitative parameter space, as indicated at step 130.

By way of example, the selection or optimization of acquisition parameters, such as FA and TR (e.g., varying $TR_{image}^{(j)}$), may include providing an initial, randomly-generated seed vector of the acquisition parameters to be selected or optimized. This seed vector may have a length, N, and be used to simulate the signal for a range, P, of quantitative parameters. For simplicity, this non-limiting example describes a $T_1$ mapping application, in which only a range, P, of $T_1$ values is simulated; however, it will be appreciated that other tissue parameters (e.g., $T_2$, proton density, off-resonance) can similarly be simulated. The seed vector and simulated quantitative parameters are used to form an N×P matrix, A. This matrix, A, can then be used to calculate a dot product matrix, $$D=A^T A \qquad (1).$$

The diagonal elements of this dot product matrix, D, indicate the closeness of a match between a magnetization trajectory resulting from a given quantitative parameter (e.g., $T_1$) and itself. The diagonal elements are, therefore, equal to one. The off-diagonal elements of the dot product matrix, D, however, indicate the quality of matching between every two different elements of the matrix, A. Discriminating between $T_1$ values in the matching process requires that the dot product of a measured magnetization trajectory with the pre-computed trajectory that is stored in the dictionary be high for the correct $T_1$ value and, ideally, zero for all others. To find the vector of acquisition parameters (e.g., TRs and FAs) that yield this optimum or a value that is sufficiently desirable, a model can be utilized. One non-limiting model is the following optimization problem:

$$\min_x f(x) \text{ such that } \sum_{i \neq j} D_{ij}(x) - \lambda \sum_{i=j} D_{ij}(x); \qquad (2a)$$

where f(x) is the function to simulate the trajectories and compute the dot product matrix, D, given a vector, x, of acquisition parameters. A penalty term, λ, is applied as well to avoid minimizing the on-diagonal elements. Another non-limiting example is:

$$\min_x f(x) = \left( \sum_{i \neq j} D(x)_{ij} \Big/ \sum_{i=j} D(x)_{ij} \right); \qquad (2b)$$

where the ratio of off-diagonal to diagonal elements is minimized. As one example, a constrained non-linear solver can be used to solve Eqns. (2a) and (2b).

However, it is contemplated that, rather than optimize over the entire TR/FA trajectory simultaneously, maximizing the discrimination at each trajectory step can be performed sequentially to yield an optimal trajectory. This premise is supported by theoretical modeling of the matching process which suggests that while each measurement step can be optimized individually it must be done sequentially since each measurement depends on all measurements prior to it. Thus, a deterministic trajectory optimization can be performed, as will be described.

Thus, process block 130 can include the following, non-limiting example steps of a sequential process. At process block 140 an initial value for FA and TR are set. These initial values may be selected by a user or otherwise acquired or preset. At process block 142, for each FA in a user-defined or preset range and for each TR in a user-defined or present range, the trajectory resulting from application of a given FA and TR to the set of tissue parameters can be simulated. At process block 144, the dot product matrix is calculated and the sum of the off-diagonal elements is calculated. At process block 146, the off-diagonal sum is stored in matrix, D.

At decision block 148, if the prior FA is not the last, the FA is adjusted to the next FA in the range at process block 150. Likewise, at decision block 152, if the prior TR is not the last in the range, the TR is adjusted to the next TR in the range at process block 154. Accordingly, a sequential process is used to work through the TR/FA trajectory, rather than optimizing over the entire TRF trajectory simultaneously. That is, at process block 156, the value of FA/TR for which D is smallest is determined. At process block 158, the FA/TR value found are appended into the FA/TR vectors. Finally, at decision block 160, if the length of FA is smaller than N, the process iterates back to process block 142, else the estimation of optimized acquisition parameters ends and process block 130 is complete.

With estimation of optimized acquisition parameters performed at process block 130, data is acquired by directing an MRI system to perform pulse sequences, such as described with respect to FIG. 1A, using the optimized acquisition parameters, as indicated at step 132.

At process block 134, images can be reconstructed from the acquired data. Quantitative parameters are then estimated by, for example, matching the reconstructed images to one or more pre-computed dictionaries, as indicated at step 136. To select the parameters, conventional matching algorithms can be used; however, in some configurations, an adaptive matching algorithm, such as the one described in co-pending PCT Application No. PCT/US15/11948, which is incorporated herein by reference in its entirety, can also be used. Parameter maps can then be generated using the estimated quantitative parameters, as indicated at step 138.

By way of non-limiting example, the above-described sequential process for estimating optimized or desired acquisition parameters was tested. In particular, to test sequential process, the dot product matrix resulting from a random length 10 trajectory was compared to an optimized trajectory for a simulated phantom with tissues having (T1,T2) values similar to those found in vivo: (500,50), (1000,100), (1500, 150), (2000,200) ms. The minimum off-diagonal sum value found at each step was normalized to the maximum off-diagonal sum possible and plotted.

Figure 2A:
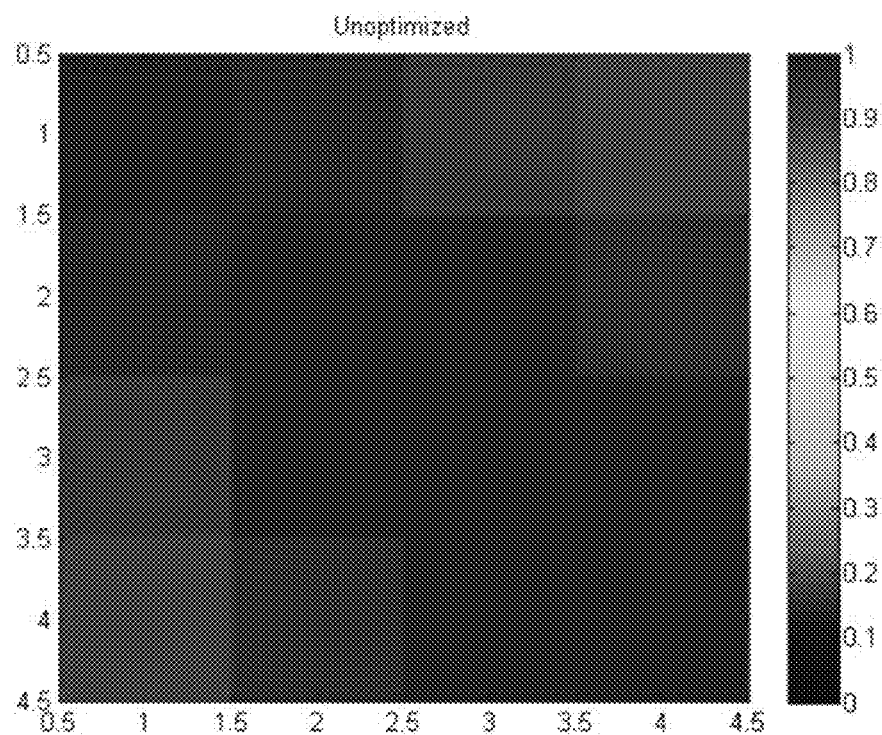
FIG. 2A is an example of an unoptimized dot product matrix for a series of tested tissue types.
Figure 2B:
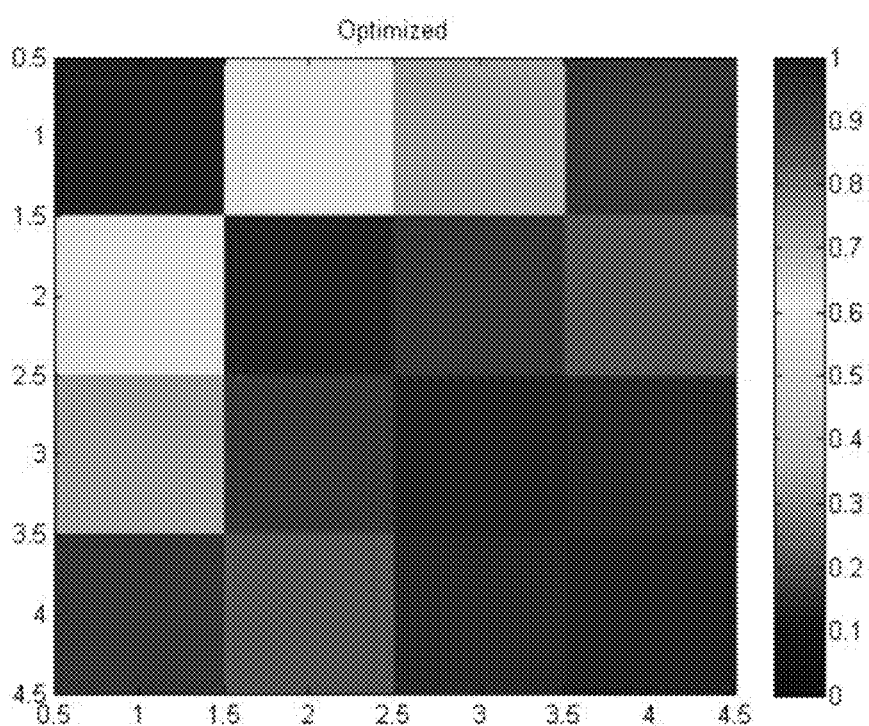
FIG. 2B is an example of an optimized dot product matrix for a series of tested tissue types.

In particular, FIG. 2A shows the unoptimized dot product matrix and FIG. 2B shows the optimized dot product matrix on a common scale. In FIG. 2A, the unoptimized dot product matrix shows little variation between the different tissue types tested that is indicative of poor discrimination between different tissues hence greater susceptibility to confounding factors potentially leading to incorrect reconstructed values. In FIG. 2B, the rapid drop in the dot product value away from the diagonal demonstrates the superior discrimination between tissues afforded by the optimized schedule. The improved discrimination can be traded for a reduced number of measurements.

Figure 2C:
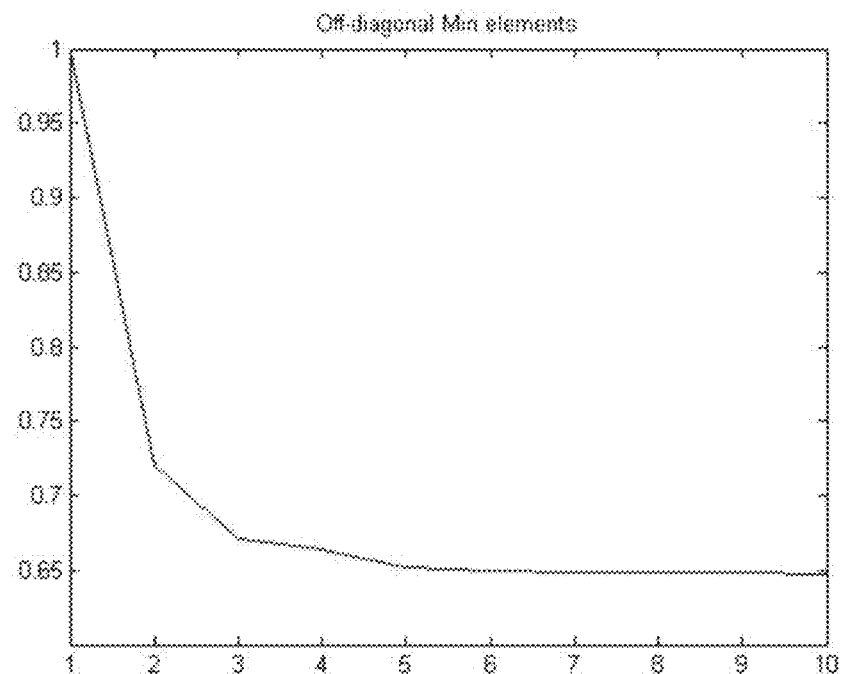
FIG. 2C is a graph showing a minimum sum of off-diagonal value found at each trajectory step when planning an acquisition allowing a fair comparison between different optimal trajectories found and illustrating the convergence of the algorithm.
Figure 2D:
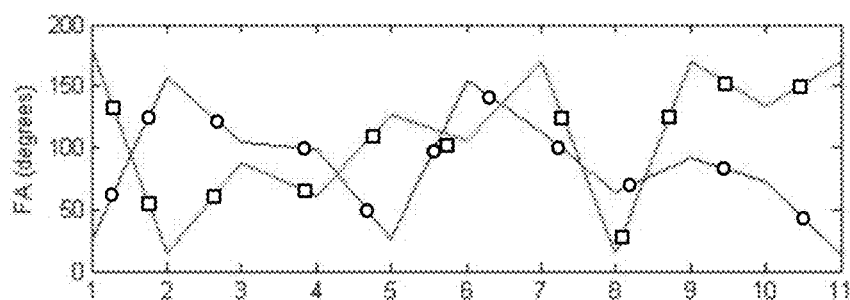
FIG. 2D is a graph showing the trajectory obtained in accordance with the present disclosure for a given tissue when using optimized flip angles, as compared to unoptimized flip angles.
Figure 2E:
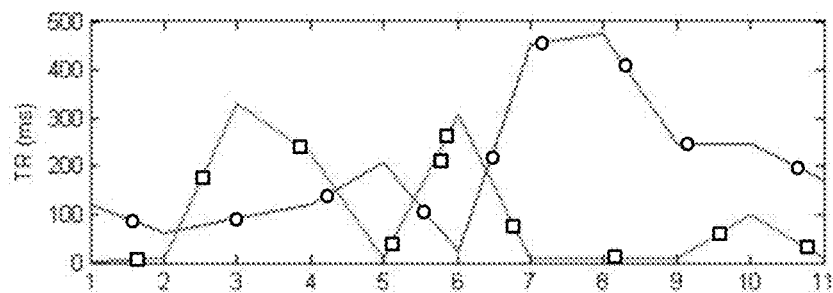
FIG. 2E is a graph showing the trajectory obtained in accordance with the present disclosure for a given tissue when using optimized repetition times, as compared to unoptimized repetition times.

The minimum sum of off-diagonal value found at each trajectory step is shown in FIG. 2C and illustrates the convergence of the algorithm, allowing a fair comparison between different optimal trajectories found. In particular, FIG. 2C indicates the capacity of the algorithm to find an improved optimum for increasing acquisition schedule lengths which allows tailoring the schedule length based on the desired discrimination. FIGS. 2D and 2E illustrate the trajectory obtained for the given tissues.

Unlike previous algorithms, in the above-described, sequential algorithm, all values of TR/FA may be tested for each measurement. Despite the exhaustive search, the algorithm run time can be deterministic and short, requiring less than 2 minutes to optimize a trajectory of length 10 which, despite the short length, yielded a reduction of over 35% in the off-diagonal sum. Although only 4 representative tissue types were tested in this example, the extension to more tissues is straightforward and does not significantly affect the required processing time. Additionally, since the algorithm is highly parallelizable processing time can be reduced even further. Importantly, given the sequential construction of the trajectories, the trajectory length can be tailored to the desired optimization level, ensuring that the minimal number of measurements will be used for any given application. Thus, the above-described system and method yields optimal trajectories in a limited or comparatively short amount of time, which reduces overall scan times.

The data was reconstructed using a dictionary that was generated by allowing the magnetization for a given set of tissue parameters to reach steady state. The reconstructed set of tissue parameter maps are shown in FIG. 2B. Specifically, FIG. 2B shows images that were acquired using the above-described system and methods and are proton-density weighted 200, $T_1$-weighted 202, $T_2$-weighted 204, and $B_0$-weighted 206.

Figure 3:
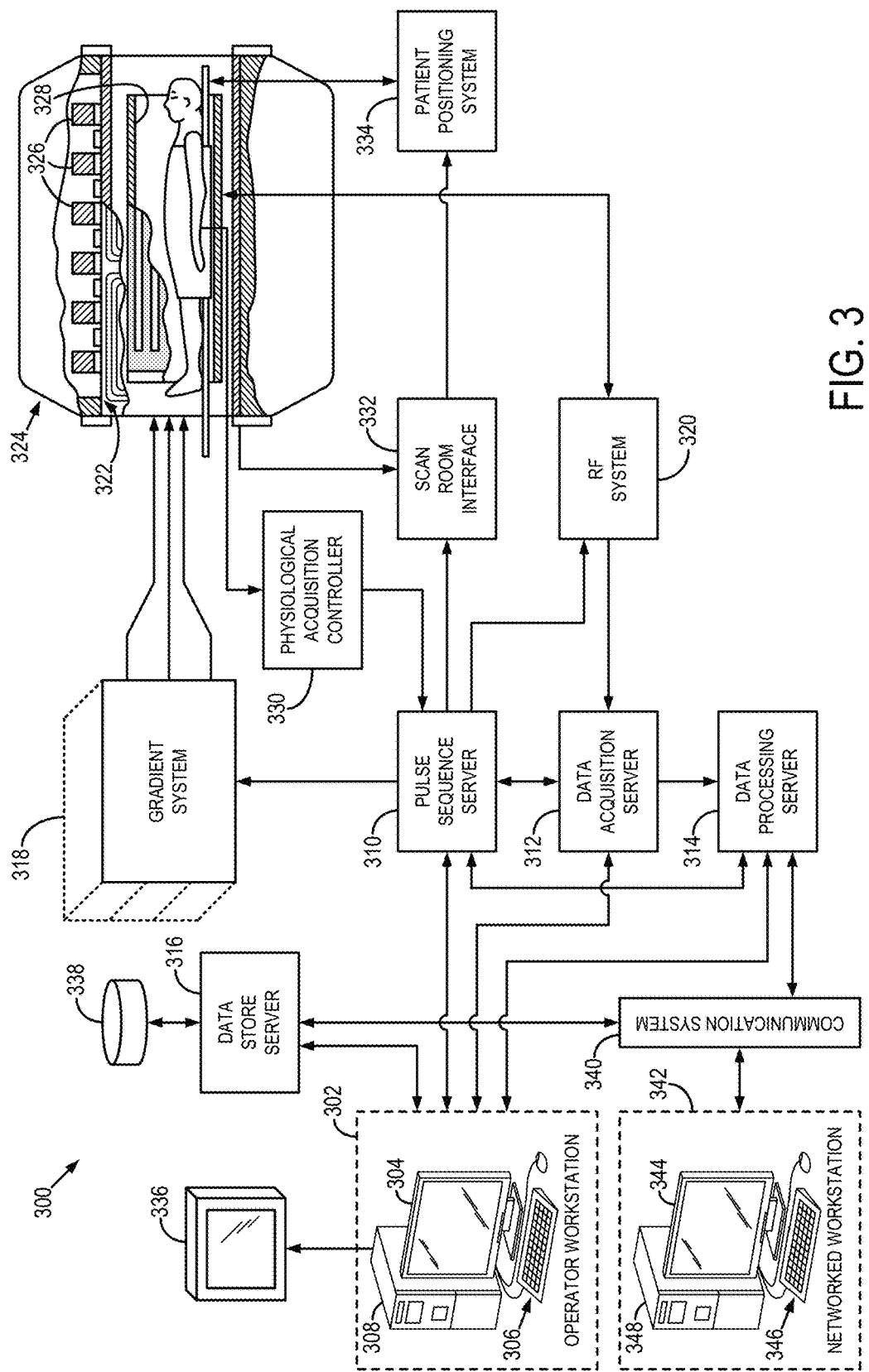
FIG. 3 is a block diagram of an example of a magnetic resonance imaging ("MRI") system for use in accordance with the present disclosure to perform the pulse sequence of FIG. 1A and/or example method of FIG. 1B.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (2);$$

and the phase of the received magnetic resonance signal may also be determined according to the following relationship:

$$\varphi = \tan^{-1}\left(\frac{Q}{I}\right). \qquad (3)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system, comprising:
   a magnet system configured to generate a polarizing magnetic field about at least a portion of a subject arranged in the MRI system;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array;
   a computer system programmed to:
   (i) perform a deterministic schedule optimization method to select pulse sequence parameters that minimize schedule lengths needed to fully sample k-space with each repetition time (TR) of the pulse sequence;
   (ii) control the MRI system to acquire magnetic resonance fingerprinting (MRF) data from the subject by performing the pulse sequence;
   (iii) estimate quantitative parameters of the subject using the MRF data by comparing the MRF data to a dictionary database; and
   (iv) generate a map of quantitative parameters of the subject using the estimated quantitative parameters of the subject and the MRF data.

2. The system of claim 1 wherein the computer system is further programmed to sequentially select the pulse sequence parameters to direct the MRI system to generate a plurality of different signal evolutions that maximize discrimination between different quantitative parameters in a selected number of repetition time (TR) periods.

3. The system of claim 2 wherein the computer system is further programmed to control the MRI system to perform a plurality of successive cycles of the pulse sequence using the selected pulse sequence parameters and wherein the MRF data represents the plurality of different signal evolutions that maximize discrimination between different quantitative parameters.

4. The system of claim 2 wherein the computer system is further programmed to minimize an objective function that simulates the acquisition parameters and compute a matrix that is based on estimated values of the pulse sequence parameters and the quantitative parameters to sequentially select the pulse sequence parameters.

5. The system of claim 4 wherein the computer system is further programmed to select initial estimates of the pulse sequence parameters and form the matrix based on the initial estimates.

6. The system of claim 4 wherein the matrix comprises a first matrix that defines a dot product between a second matrix and a transpose of the second matrix, and wherein the second matrix includes estimates of the pulse sequence parameters and simulated values for the quantitative parameters.

7. The system of claim 4 wherein the computer system is further programmed to minimize the objective function by searching for the pulse sequence parameters that minimize a difference between a sum of off-diagonal elements of the matrix and a sum of on-diagonal elements of the matrix.

8. The system of claim 1 wherein the computer system is further programmed to perform the pulse sequence to maintain residual transverse magnetization through a delay period performed between successive cycles of the pulse sequence, wherein the delay period is selected to allow spins of different tissue types within the subject to evolve differently as a function of tissue parameters within the different tissue types during the delay period.

9. A method for generating a map of quantitative parameters of a subject using a magnetic resonance imaging (MRI) system, the method including steps comprising:
   (i) performing a schedule creation that sequentially selects discrimination at each time step to yield a preferred schedule;
   (ii) controlling the MRI system to perform a pulse sequence using the preferred schedule to acquire magnetic resonance fingerprinting (MRF) data;

(ii) estimating quantitative parameters of the subject using the MRF data by comparing the MRF data to a dictionary database; and (iii) generating a map of quantitative parameters of the subject using the estimated quantitative parameters of the subject and the MRF data.

10. The method of claim 9 wherein (ii) further includes acquiring a first portion of the MRF data by fully sampling k-space, line-by-line, using a first flip angle (FA) and first repetition time (TR) and acquiring a second portion of the MRF data by fully sampling k-space, line-by-line, using a second FA and second TR and wherein at least one of the second FA or the second TR are different from the first FA and first TR.

11. The method of claim 9 wherein the MRF data is acquired using a first flip angle and a second flip angle that are different flip angles.

12. The method of claim 9 wherein the dictionary database accounts for steady-state MRF data acquisition.

13. A method for generating a map of quantitative parameters of a subject using a magnetic resonance imaging (MRI) system, the method including steps comprising:

(i) performing a deterministic schedule optimization method to select pulse sequence parameters that minimize schedule lengths needed to fully sample k-space with each repetition time (TR) of the pulse sequence;

(ii) controlling the MRI system to acquire magnetic resonance fingerprinting (MRF) data from the subject by performing the pulse sequence;

(iii) estimating quantitative parameters of the subject using the MRF data by comparing the MRF data to a dictionary database; and (iv) generating a map of quantitative parameters of the subject using the estimated quantitative parameters of the subject and the MRF data.

14. The method of claim 13 wherein the pulse sequence includes maintaining residual transverse magnetization through a delay period performed between successive cycles of the pulse sequence, wherein the delay period is selected to allow spins of different tissue types within the subject to evolve differently as a function of tissue parameters within the different tissue types during the delay period.

15. The method of claim 13 wherein step (i) further includes sequentially selecting the pulse sequence parameters that are selected to direct the MRI system to generate a plurality of different signal evolutions that maximize discrimination between different quantitative parameters in a selected number of repetition time (TR) periods.

16. The method of claim 15 wherein step (ii) includes acquiring the MRF data with the MRI system by directing the MRI system to perform a plurality of successive cycles of the pulse sequence using the selected pulse sequence parameters, the MRF data representing the plurality of different signal evolutions that maximize discrimination between different quantitative parameters.

17. The method of claim 15 wherein sequentially selecting the pulse sequence parameters includes minimizing an objective function that simulates the pulse sequence parameters and computed a matrix that is based on estimated values of the acquisition parameters and the quantitative parameters to be estimated.

18. The method of claim 17 further comprising selecting initial estimates of the pulse sequence parameters and forming the matrix based on the initial estimates.

19. The method of claim 17 wherein the matrix comprises a first matrix that defines a dot product between a second matrix and a transpose of the second matrix, wherein the second matrix includes estimates of the pulse sequence parameters and simulated values for the quantitative parameters.

20. The method of claim 17 wherein the objective function is minimized by searching for the pulse sequence parameters that minimize a difference between a sum of off-diagonal elements of the matrix and a sum of on-diagonal elements of the matrix.

* * * * *

UNITED STATES PATENT AND TRADEMARK OFFICE
CERTIFICATE OF CORRECTION

PATENT NO. : 10,466,321 B2  
APPLICATION NO. : 15/294989  
DATED : November 5, 2019  
INVENTOR(S) : Ouri Cohen Page 1 of 1

It is certified that error appears in the above-identified patent and that said Letters Patent is hereby corrected as shown below:

In the Specification

Column 4, Line 63, "$TR_{image}^{(j)}$" should read -- $TR_{image}^{(j)}$ --.

Column 5, Line 39, Eq. (2b), " $\min_x f(x) = \left( \sum_{i \neq j} D(x)_{ij} / \sum_{i=j} D(x)_{ij} \right)$ " should read -- $\min_x f(x) = \left( \sum_{i \neq j} D(x)_{ij} / \sum_{i=j} D(x)_{ij} \right)$ --.

Signed and Sealed this  
Twenty-fourth Day of December, 2019

Andrei Iancu  
*Director of the United States Patent and Trademark Office*